(12) United States Patent
Chen et al.

(10) Patent No.: US 10,790,248 B2
(45) Date of Patent: Sep. 29, 2020

(54) THREE-DIMENSIONAL INTEGRATED CIRCUIT AND METHOD OF MANUFACTURING THE SAME

(71) Applicant: United Microelectronics Corp., Hsinchu (TW)

(72) Inventors: Chun-Hung Chen, Tainan (TW); Ming-Tse Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/280,938

(22) Filed: Feb. 20, 2019

(65) Prior Publication Data
US 2020/0235063 A1 Jul. 23, 2020

(30) Foreign Application Priority Data
Jan. 23, 2019 (CN) .......................... 2019 1 0062636

(51) Int. Cl.
*H01L 23/00* (2006.01)
*H01L 25/065* (2006.01)
*H01L 25/00* (2006.01)

(52) U.S. Cl.
CPC .............. *H01L 24/08* (2013.01); *H01L 24/03* (2013.01); *H01L 24/05* (2013.01); *H01L 24/89* (2013.01); *H01L 25/0657* (2013.01); *H01L 25/50* (2013.01); *H01L 2224/03602* (2013.01); *H01L 2224/05082* (2013.01); *H01L 2224/05124* (2013.01); *H01L 2224/05147* (2013.01); *H01L 2224/05157* (2013.01); *H01L 2224/05166* (2013.01); *H01L 2224/05181* (2013.01); *H01L 2224/05184* (2013.01); *H01L 2224/05649* (2013.01); *H01L 2224/05657* (2013.01); *H01L 2224/05686* (2013.01); *H01L 2224/08058* (2013.01); *H01L 2224/08145* (2013.01); *H01L 2224/8012* (2013.01); *H01L 2224/80895* (2013.01); *H01L 2224/80896* (2013.01); *H01L 2924/0132* (2013.01); *H01L 2924/04941* (2013.01); *H01L 2924/04953* (2013.01)

(58) Field of Classification Search
CPC . H01L 2224/08058; H01L 2224/08145; H01L 2224/80895; H01L 2224/80896
See application file for complete search history.

(56) References Cited

U.S. PATENT DOCUMENTS 9,728,521 B2 8/2017 Tsai et al.
2017/0358553 A1* 12/2017 Kim ........................ H01L 24/83

* cited by examiner

*Primary Examiner* — Daniel P Shook
(74) *Attorney, Agent, or Firm* — J.C. Patents (57) ABSTRACT

Provided are a three-dimensional integrated circuit (3DIC) and a method of manufacturing the same. The 3DIC includes a first wafer, a second wafer, and a hybrid bonding structure. The second wafer is bonded to the first wafer by the hybrid bonding structure. The hybrid bonding structure includes a blocking layer between a hybrid bonding dielectric layer and a hybrid bonding metal layer.

18 Claims, 7 Drawing Sheets

THREE-DIMENSIONAL INTEGRATED CIRCUIT AND METHOD OF MANUFACTURING THE SAME

CROSS REFERENCE TO RELATED APPLICATION

This application claims the priority benefit of China application serial no. 201910062636.1, filed on Jan. 23, 2019. The entirety of the above-mentioned patent application is hereby incorporated by reference herein and made a part of specification.

BACKGROUND OF THE INVENTION

Field of the Invention

The invention relates to a package and a method of manufacturing the same, and more particularly, to a three-dimensional integrated circuit (3DIC) and a method of manufacturing the same.

Description of Related Art

With the miniaturization of electronic chips and the multifunction demand, chip integration has become quite complex, and package technology has also changed with the needs of its products. In recent years, the two-dimensional integrated circuit (2DIC) has been vertically integrated into a 3DIC (three-dimensional integrated circuit (3DIC)), thereby improving the processing ability and power consumption of the integrated circuit. However, the 3DIC process still faces many challenges.

SUMMARY OF THE INVENTION

The invention provides a three-dimensional integrated circuit (3DIC) of disposing the blocking layer between the hybrid bonding dielectric layer and the hybrid bonding metal layer to suppress the metal element of the metal pad from diffusing into the bonding dielectric layer, thereby avoiding the leakage current.

The invention provides a three-dimensional integrated circuit (3DIC). The 3DIC includes a first wafer, a second wafer, and a hybrid bonding structure. The second wafer is bonded to the first wafer by the hybrid bonding structure. The hybrid bonding structure includes a blocking layer between a hybrid bonding dielectric layer and a hybrid bonding metal layer.

In an embodiment of the invention, a material of the blocking layer is from the hybrid bonding dielectric layer and the hybrid bonding metal layer, and the blocking layer is in direct contact with the hybrid bonding dielectric layer and the hybrid bonding metal layer.

In an embodiment of the invention, the blocking layer includes manganese oxide (MnO), manganese silicate (MnSiO), manganese oxynitride (MnON), cobalt oxide (CoO), or a combination thereof.

In an embodiment of the invention, a thickness of the blocking layer is between 0.5 nm and 1.0 nm.

In an embodiment of the invention, the hybrid bonding structure includes a first portion, a second portion, and a third portion. The first portion includes a first bonding metal layer and a second bonding metal layer bonding to each other. The second portion includes a first bonding dielectric layer and a second bonding dielectric layer bonding to each other. The third portion includes the first bonding metal layer and the second bonding dielectric layer bonding to each other, the first bonding dielectric layer and the second bonding metal layer bonding to each other, and the blocking layer disposed between the first bonding metal layer and the second bonding dielectric layer and disposed between the first bonding dielectric layer and the second bonding metal layer.

In an embodiment of the invention, at least one of the first bonding metal layer and the second bonding metal layer includes a primary metal, the primary metal includes Mn, Co, or a combination thereof, and a content of the primary metal is greater than 50 wt %.

In an embodiment of the invention, the first bonding dielectric layer and the second bonding dielectric layer respectively include silicon oxide, silicon nitride, silicon oxynitride, nitrogen-doped carbide, silicon carbide, silicon oxycarbide, or a combination thereof.

In an embodiment of the invention, the first wafer includes a first metal pad embedded in a first dielectric layer, the first metal pad is electrically connected to the first bonding metal layer, and an interface between the first metal pad and the first bonding metal layer includes a flat surface, a curved surface, or a combination thereof.

In an embodiment of the invention, the first metal pad includes a first metal layer and a first barrier layer. The first barrier layer encapsulates a surface of the first metal layer to separate the first metal layer from the first dielectric layer, wherein the first bonding metal layer covers a top surface of the first metal layer and a top surface of the first barrier layer.

In an embodiment of the invention, the first metal layer and the first bonding metal layer have different materials, and the first metal layer includes Cu, Al, AlCu, W, or a combination thereof.

The invention provides a method of manufacturing a 3DIC including the following steps. A first wafer is provided. A second wafer is bonded to the first wafer by a hybrid bonding structure. The hybrid bonding structure includes a blocking layer formed between a hybrid bonding dielectric layer and a hybrid bonding metal layer.

In an embodiment of the invention, the providing the first wafer includes: forming a first interconnect structure on a first substrate; sequentially forming a first dielectric layer and a first bonding dielectric layer on the first interconnect structure; forming a first opening in the first dielectric layer and the first bonding dielectric layer to expose the first interconnect structure; filling in the first opening with a first metal material; performing a grinding process on the first metal material to form a first metal pad and form a first recess on the first metal pad; and forming a first bonding metal layer in the first recess, thereby forming a first bonding structure.

In an embodiment of the invention, a bottom surface of the first recess includes a flat surface, a curved surface, or a combination thereof.

In an embodiment of the invention, a top surface of the first metal pad is lower than a top surface of the first bonding dielectric layer.

In an embodiment of the invention, a top surface of the first bonding metal layer is substantially coplanar with a top surface of the first bonding dielectric layer.

In an embodiment of the invention, the step of bonding the second wafer to the first wafer includes: forming a second bonding structure on the second wafer, wherein the second bonding structure includes a second bonding dielectric layer and a second bonding metal layer embedded in the second bonding dielectric layer; aligning the first bonding structure with the second bonding structure; and performing a bonding process, so that the first bonding metal layer and the second bonding metal layer are bonded to each other, the first bonding dielectric layer and the second bonding dielectric layer are bonded to each other, and the blocking layer is formed between the first bonding metal layer and the second bonding dielectric layer and formed between the first bonding dielectric layer and the second bonding metal layer.

In an embodiment of the invention, the blocking layer is made by reacting the first bonding metal layer with the second bonding dielectric layer and reacting the first bonding dielectric layer with the second bonding metal layer.

In an embodiment of the invention, the blocking layer includes manganese oxide (MnO), manganese silicate (MnSiO), manganese oxynitride (MnON), cobalt oxide (CoO), or a combination thereof.

In an embodiment of the invention, at least one of the first bonding metal layer and the second bonding metal layer includes a primary metal, the primary metal includes Mn, Co, or a combination thereof, and a content of the primary metal is greater than 50 wt %.

In an embodiment of the invention, the first bonding dielectric layer and the second bonding dielectric layer respectively include silicon oxide, silicon nitride, silicon oxynitride, nitrogen-doped carbide, silicon carbide, silicon oxycarbide, or a combination thereof.

Based on the above, in the present invention, the bonding metal layer is formed on the metal pad. In the case, the blocking layer is formed between the bonding metal layer and the bonding dielectric layer when an offset is occurred in the wafer-to-wafer bonding. The blocking layer is able to suppress the metal element in the metal pad from diffusing into the bonding dielectric layer, thereby avoiding the leakage current.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1E are schematic cross-sectional views illustrating a method of manufacturing a 3DIC according to a first embodiment of the disclosure.

Figure 1A:
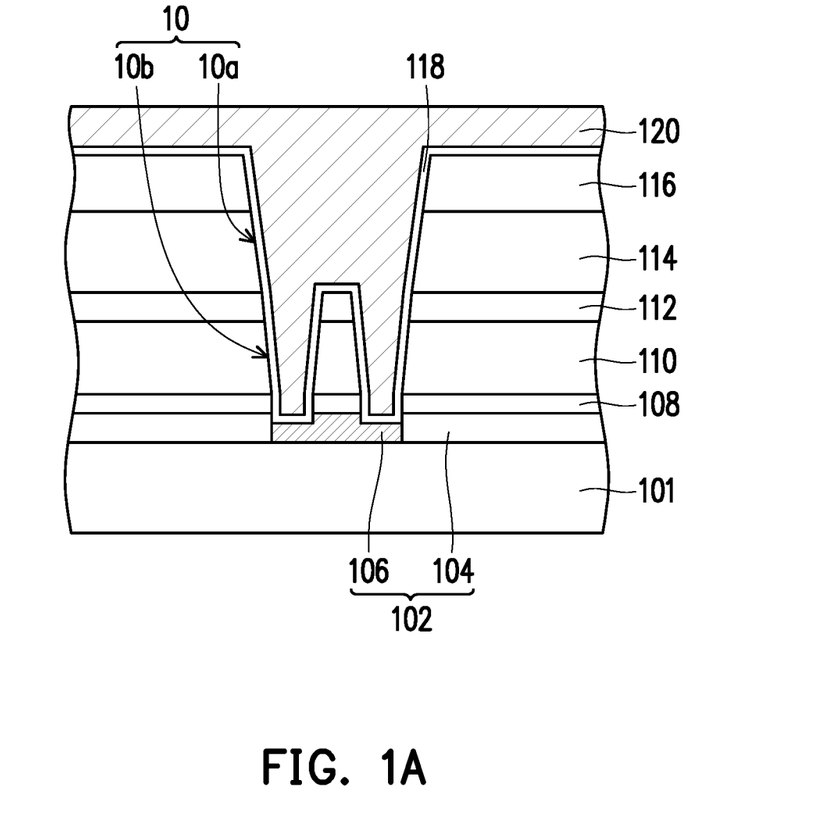
FIG. 1A to FIG. 1E are schematic cross-sectional views illustrating a method of manufacturing a 3DIC according to a first embodiment of the disclosure.
Figure 1B:
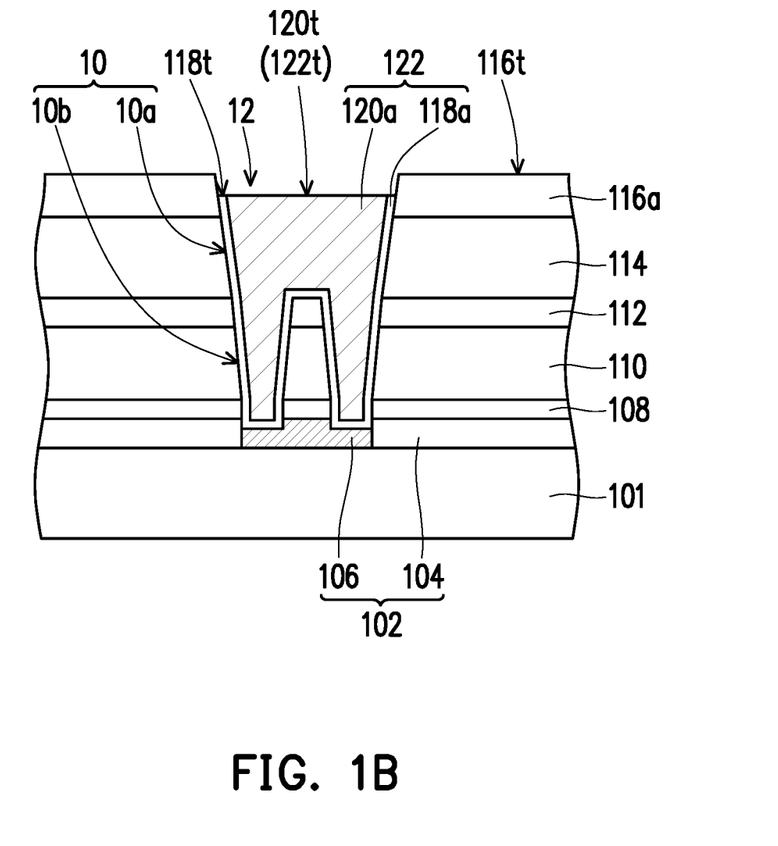
Figure 1C:
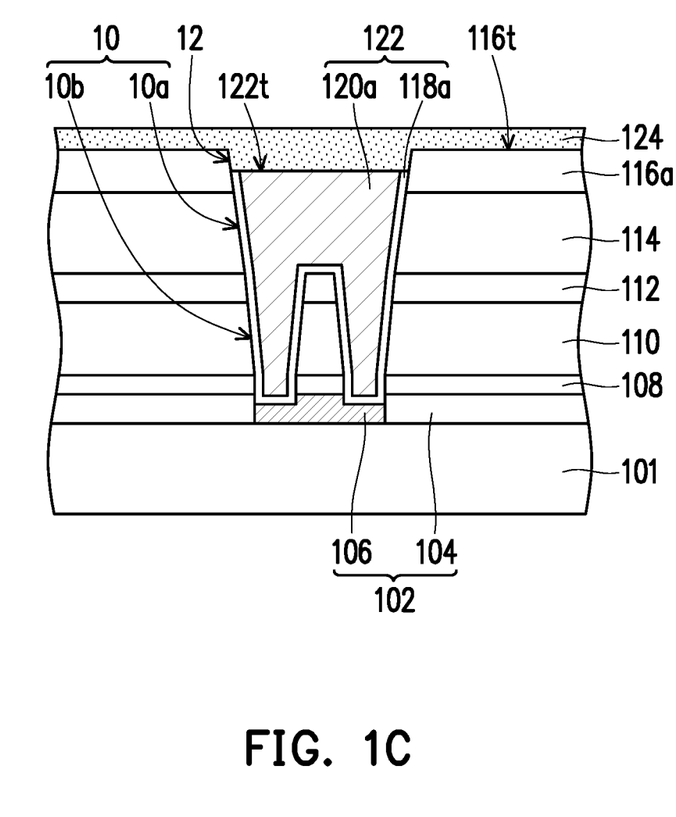
Figure 1D:
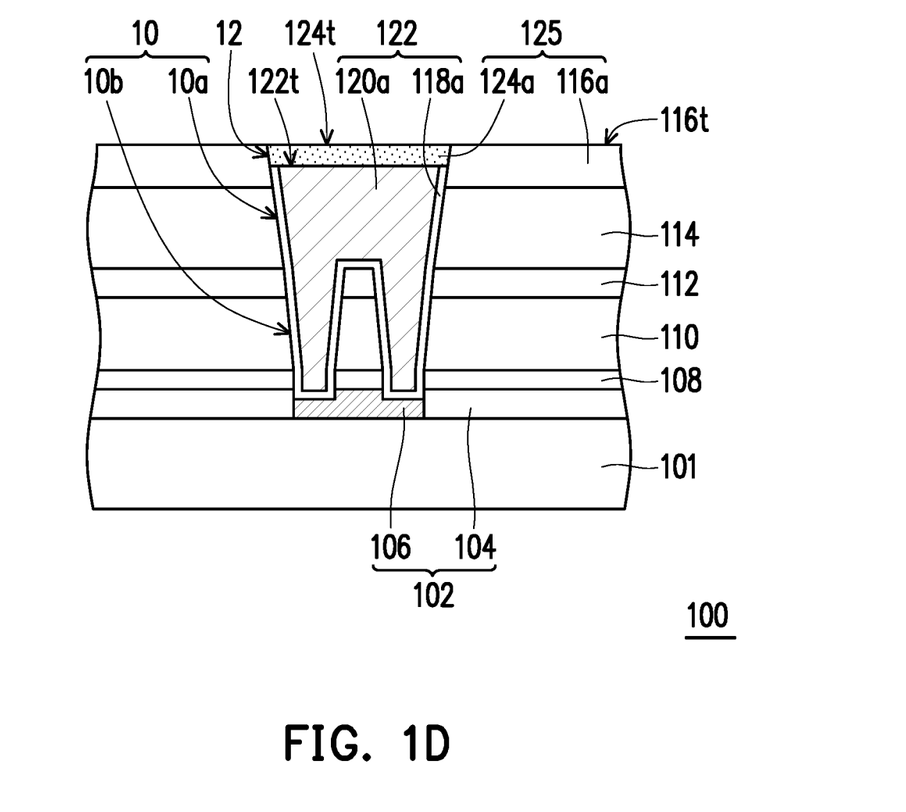

Referring to FIG. 1A to FIG. 1E, in the first embodiment of the present invention, a method of manufacturing the 3DIC is provided and includes following steps. First, a first wafer 100 having the first bonding structure 125 thereon (as shown in FIG. 1D) is provided.

Specifically, as shown in FIG. 1A, a first interconnect structure 102 is formed on a first substrate 101. In an embodiment, the first substrate 101 includes a semiconductor substrate, such as a silicon substrate. The first interconnect structure 102 includes a dielectric layer 104 and an interconnect layer 106. In some embodiments, the interconnect layer 106 includes a multilayer structure that is embedded in the dielectric layer 104. In the embodiment, a topmost interconnect layer 106 may be an aluminum (Al) pad or a copper (Cu) pad, but the invention is not limited thereto. In other embodiments, the topmost interconnect layer 106 may also be a top metal layer. In an alternative embodiment, the interconnect layer 106 may be electrically connected to an underlying active component (e.g., a transistor, a diode, or the like) or an underlying passive component (e.g., a capacitor, a resistor, or the like), but the invention is not limited thereto.

Dielectric layers 108, 110, 112, 114 (the stacked layer may be referred to as a first dielectric layer) and a first bonding dielectric layer 116 are then sequentially formed on the first interconnect structure 102. In an embodiment, materials of the dielectric layers 108, 110, 112, 114 respectively include silicon oxide, silicon nitride, silicon oxynitride, nitrogen-doped carbide, silicon carbide, silicon oxycarbide or a combination thereof, which may be formed by thermal oxidation, chemical vapor deposition (CVD), or the like. In another embodiment, the dielectric layers 108, 110, 112, 114 have different dielectric materials. For example, the dielectric layer 108 may be nitrogen-doped carbide; the dielectric layer 110 may be tetraethosiloxane (TEOS); the dielectric layer 112 may be a composite layer of silicon nitride and silicon oxide; and the dielectric layer 114 may be TEOS. In some embodiments, a material of the first bonding dielectric layer 116 includes silicon oxide, silicon nitride, silicon oxynitride, nitrogen-doped carbide, silicon carbide, silicon oxycarbide, or a combination thereof, which may be formed by thermal oxidation, CVD, or the like. In an alternative embodiment, the first bonding dielectric layer 116 and the dielectric layer 114 may have the same material or different materials. For example, the first bonding dielectric layer 116 and the dielectric layer 114 may both be TEOS. Additionally, the first bonding dielectric layer 116 may be nitrogen-doped carbide and the dielectric layer 114 may be TEOS.

After forming the first bonding dielectric layer 116, a first opening 10 is formed in the dielectric layers 108, 110, 112, 114 and the first bonding dielectric layer 116. As shown in FIG. 1A, the first opening 10 includes a trench 10a and a via opening 10b. The trench 10a and the via opening 10b are in communication with each other and the trench 10a is located on the via opening 10b. In some embodiments, the first opening 10 may be formed by a trench first process. In detail, the first bonding dielectric layer 116 and the dielectric layer 114 are patterned by a lithography process and an etching process to form the trench 10a in the first bonding dielectric layer 116 and the dielectric layer 114. In the present embodiment, the dielectric layer 112 may be used as an etching stop layer for forming the trench 10a. Then, a portion of the dielectric layer 112 exposed by the trench 10a and the underlying dielectric layer 110, 108 are patterned by another lithography process and another etching process to form the via opening 10b therein. In the case, as shown in FIG. 1A, the via opening 10b corresponds to and exposes a top surface of the interconnect layer 106 in the first interconnect structure 102. In the present embodiment, the interconnect layer 106 may be used as an etching stop layer for forming the via opening 10b.

After forming the first opening 10, a first barrier layer 118 and a first metal material 120 are formed in the first opening 10. As shown in FIG. 1A, the first barrier layer 118 conformally covers a surface of the first opening 10 and a top surface of the first bonding dielectric layer 116, and contacts the interconnect layer 106 in the first interconnect structure 102. In an embodiment, a material of the first barrier layer 118 includes Ti, TiN, Ta, TaN, CoW, or a combination thereof, and may be formed by plating, CVD, atomic layer deposition (ALD), physical vapor deposition (PVD), or the like. The first metal material 120 is filled into the first opening 10 and extends from the surface of the first opening 10 to cover the top surface of the first bonding dielectric layer 116. In an embodiment, a material of the first metal material 120 includes copper (Cu), aluminum (Al), aluminum copper (AlCu), tungsten (W), or a combination thereof, and may be formed by plating, CVD, PVD, or the like.

Referring to FIG. 1A and FIG. 1B, a grinding process is performed on the first metal material 120 to form a first metal pad 122 in the first opening 10. The first metal pad 122 may be referred to as a dual damascene structure through the process steps shown in FIGS. 1A and 1B. In an embodiment, the grinding process may be, for example, a chemical mechanical polishing (CMP) process. The first bonding dielectric layer 116a may be referred to as a polishing stop layer of the grinding process. Specifically, as shown in FIG. 1B, the first metal pad 122 includes a first barrier layer 118a and a first metal layer 120a. The first barrier layer 118a encapsulates a surface of the first metal layer 120a to separate the first metal layer 120a from the dielectric layers 108, 110, 112, 114 and the first bonding dielectric layer 116a. During the foregoing grinding process, in addition to remove a portion of the first metal material 120, a portion of the first barrier layer 118 and a portion of the first bonding dielectric layer 116 are also removed. In the case, as shown in FIG. 1B, a top surface 122t of the first metal pad 122 is lower than a top surface 116t of the first bonding dielectric layer 116a. That is, a first recess 12 is formed on the first metal pad 122. In FIG. 1B, a top surface 120t of the first metal layer 120a and a top surface 118t of the first barrier layer 118a are substantially coplanar, so that a bottom surface of the first recess 12 is a flat surface, but the present invention does not limit. In other embodiments, the top surface 120t of the first metal layer 120a may also be lower than the top surface 118t of the first barrier layer 118a. In other words, a portion of the first barrier layer 118a may also be formed on a sidewall of the first recess 12.

Referring to FIG. 1C, a first bonding metal material 124 is formed to fill into the first recess 12 and extends to cover the top surface 116t of the first bonding dielectric layer 116a. In an embodiment, the first bonding metal material 124 includes a primary metal. The primary metal may include manganese (Mn), cobalt (Co), or a combination thereof, and a content of the primary metal is greater than 50 wt %. The first bonding metal material 124 may be formed by plating, CVD, PVD, or the like. In another embodiment, the first bonding metal material 124 and the first metal layer 120a may have different materials. For example, the first bonding metal material 124 may be a manganese layer; and the first metal layer 120a may be a copper layer.

Referring to FIG. 1C and FIG. 1D, a planarization process is performed to remove a portion of the first bonding metal material 124 to expose the top surface 116t of the first bonding dielectric layer 116a. In the case, a first bonding metal layer 124a is formed in the first recess 12 and covers the top surfaces of the first metal layer 120a and the first barrier layer 118a. In some embodiments, a top surface 124t of the first bonding metal layer 124a is substantially coplanar with the top surface 116t of the first bonding dielectric layer 116a. In an embodiment, the planarization process may be a CMP process, an etching back process, or a combination thereof. After forming the first bonding metal layer 124a, the first wafer 100 having the first bonding structure 125 thereon is accomplished, as shown in FIG. 1D. The first bonding structure 125 includes the first bonding dielectric layer 116a and the first bonding metal layer 124a embedded in the first bonding dielectric layer 116a. The first bonding metal layer 124a is electrically connected to and contacts the first metal pad 122. In some embodiments, the first wafer 100 may be a semiconductor wafer, a semiconductor chip, a semiconductor die, or the like.

Figure 1E:
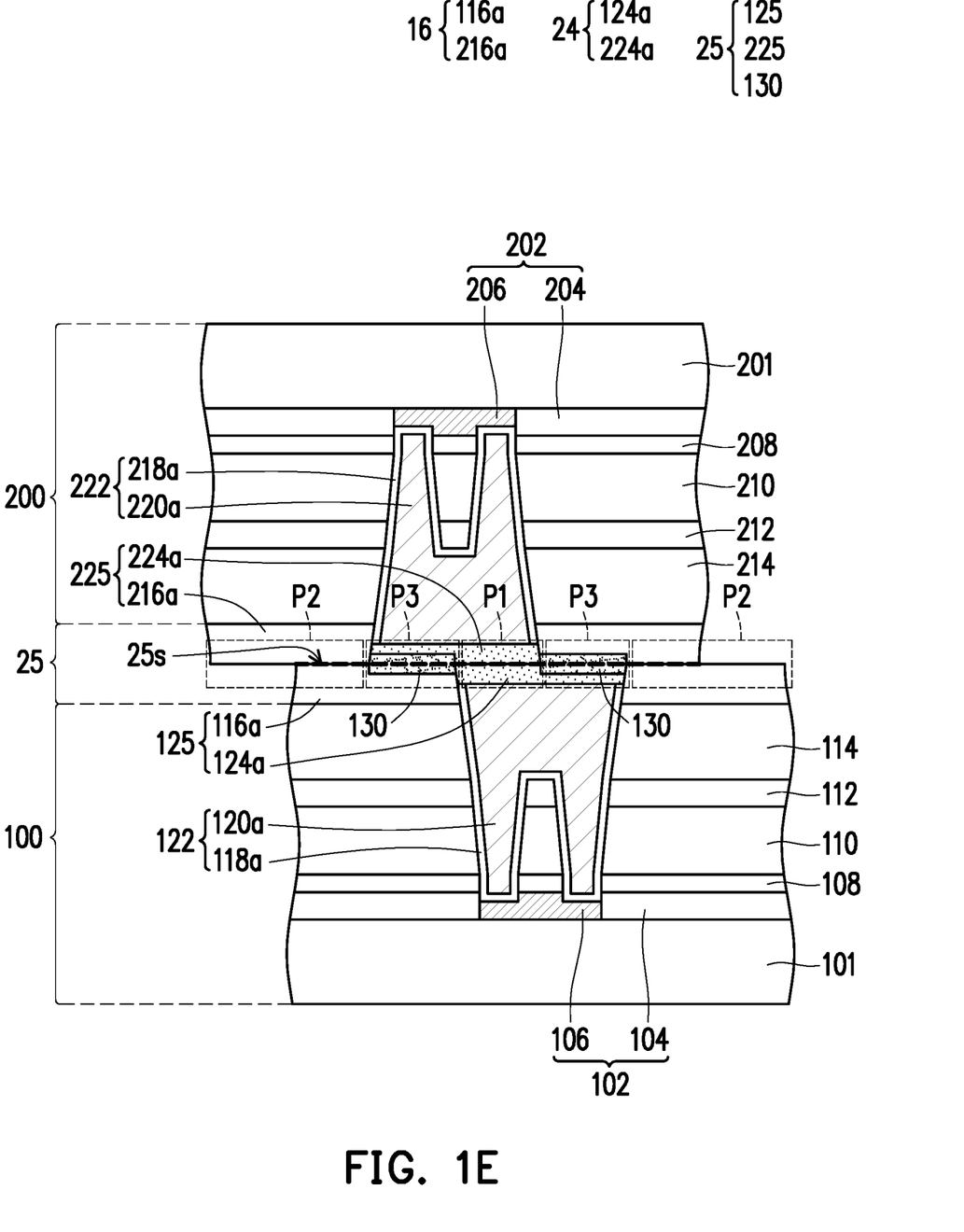

Referring to FIG. 1D and FIG. 1E, a second wafer 200 having a second bonding structure 225 thereon is provided. In detail, as shown in FIG. 1E, the second wafer 200 includes a second substrate 201, a second interconnect structure 202, dielectric layers 208, 210, 212, 214, and a second metal pad 222. The second interconnect structure 202 includes a dielectric layer 204 and an interconnect layer 206 embedded in the dielectric layer 204. The second bonding structure 225 includes a second bonding dielectric layer 216a and a second bonding metal layer 224a embedded in the second bonding dielectric layer 216a. The second metal pad 222 includes a second barrier layer 218a and a second metal layer 220a. In some embodiments, the first bonding metal layer 124a and the second bonding metal layer 224a may have a same material or different materials. The first bonding dielectric layer 116a and the second bonding dielectric layer 216a may also have a same material or different materials. Since the configuration, material, and formation method of the second wafer 200 are similar to those of the first wafer 100, and are described in detail in the above embodiments, details thereof are omitted here.

Next, the second wafer 200 is flipped upside down, so as to mount the second wafer 200 onto the first wafer 100. Specifically, the second bonding structure 225 is aligned with the first bonding structure 125 before the second wafer 200 is bonded to the first wafer 100. Thereafter, a bonding process is performed, so that the first bonding metal layer 124a and the second bonding metal layer 224a are bonded to each other, the first bonding dielectric layer 116a and the second bonding dielectric layer 216a are bonded to each other, and a blocking layer 130 is formed between the first bonding metal layer 124a and the second bonding dielectric layer 216a and formed between the first bonding dielectric layer 116a and the second bonding metal layer 224a. In one embodiment, the bonding process includes applying pressure and heat, so as to hybrid bond the first bonding structure 125 and the second bonding structure 225 together, thereby forming a hybrid bonding structure 25.

It should be noted that the hybrid bonding method involves at least two types of bonding methods including a metal-to-metal bonding and a non-metal-to-non-metal bonding (e.g., a dielectric-to-dielectric bonding or a fusion bonding). As shown in FIG. 1E, the hybrid bonding structure 25 includes a first portion P1, a second portion P2, and a third portion P3. The first portion P1 may include the first bonding metal layer 124a and the second bonding metal layer 224a bonding together by the metal-to-metal bonding. The second portion P2 may include the first bonding dielectric layer 116a and the second bonding dielectric layer 216a bonding together by the non-metal-to-non-metal bonding. The third portion P3 may include the blocking layer 130 that is formed by the first bonding dielectric layer 116a contacting with the second bonding metal layer 224a and formed by the second bonding dielectric layer 216a also contacting with the first bonding metal layer 124a when the alignment is shifted.

In one embodiment, a material of the blocking layer 130 includes manganese oxide (MnO), manganese silicate (MnSiO), manganese oxynitride (MnON), cobalt oxide (CoO), or a combination thereof. In another embodiment, the blocking layer 130 is formed by reacting the first bonding metal layer 124a with the second bonding dielectric layer 216a and reacting the first bonding dielectric layer 116a with the second bonding metal layer 224a. That is, the blocking layer 130 is formed along a direction from a bonding interface 25s between the first bonding structure 125 and the second bonding structure 225 toward the first wafer 100 and the second wafer 200. In the case, the blocking layer 130 may be referred to as a self-aligned structure or a continuous structure to suppress the metal element (e.g., copper) in the metal pads 122, 222 from diffusing into the hybrid bonding dielectric layer 16 along the bonding interface 25s. From a microscopic point of view, the blocking layer 130 is across the bonding interface 25s between the first bonding structure 125 and the second bonding structure 225. In other words, a portion of the blocking layer 130 is embedded in the first bonding structure 125, and another portion of the blocking layer 130 is embedded in the second bonding structure 225. In an alternative embodiment, the blocking layer 130 may have a thickness between 0.5 nm and 1.0 nm. In other embodiments, the material of the blocking layer 130 is derived from the hybrid bonding dielectric layer 16 and the hybrid bonding metal layer 24, and the blocking layer 130 are in direct contact with the hybrid bonding dielectric layer 16 and the hybrid bonding metal layer 24.

In short, as shown in FIG. 1E, the first wafer 100 and the second wafer 200 are face-to-face bonded together by the hybrid bonding structure 25. In the present embodiment, the blocking layer 130 is disposed between the hybrid bonding dielectric layer 16 and the hybrid bonding metal layer 24, which effectively suppresses the metal element (e.g., copper) in the metal pads 122, 222 from diffusing into the hybrid bonding dielectric layer 16, thereby avoiding the leakage current.

Figure 2:
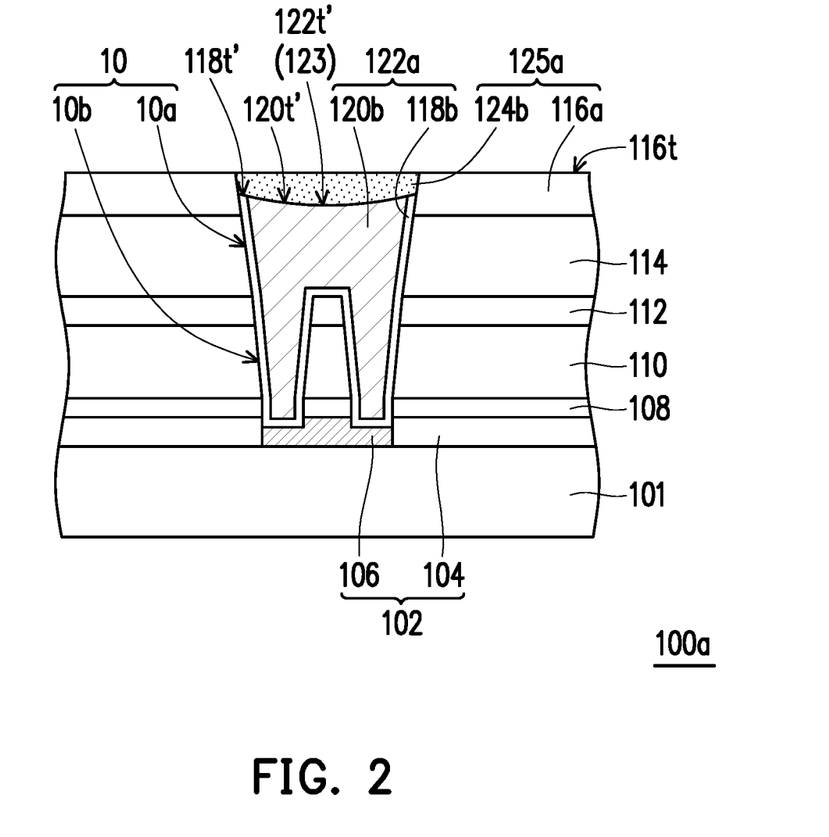
FIG. 2 is a schematic cross-sectional view illustrating a 3DIC according to a second embodiment of the disclosure.

FIG. 2 is a schematic cross-sectional view illustrating a 3DIC according to a second embodiment of the disclosure.

Referring to FIG. 2, basically, a first wafer 100a illustrated in FIG. 2 is similar to the first wafer 100 illustrated in FIG. 1D. The difference therebetween is that a top surface 122t' of the first metal pad 122a of FIG. 2 (or an interface 123 between the first metal pad 122a and the first bonding metal layer 124b) is a curved surface or an arc surface compared to the first metal pad 122 having the flat top surface 122t illustrated in FIG. 1D. In the embodiment, the recipe or other process parameters of the slurry in the foregoing grinding process may be adjusted, so that a polishing rate to the first metal material is faster in the grinding process, thereby forming the first metal pad 122a with the curved surface 122t'. As shown in FIG. 2, the curved surface 122t' is recessed along a direction toward the first substrate 101. Additionally, the first metal pad 122a includes a first barrier layer 118b and a first metal layer 120b. A top surface 118t' of the first barrier layer 118b and a top surface 120t' of the first metal layer 120b are also recessed along the direction toward the first substrate 101.

Figure 3:
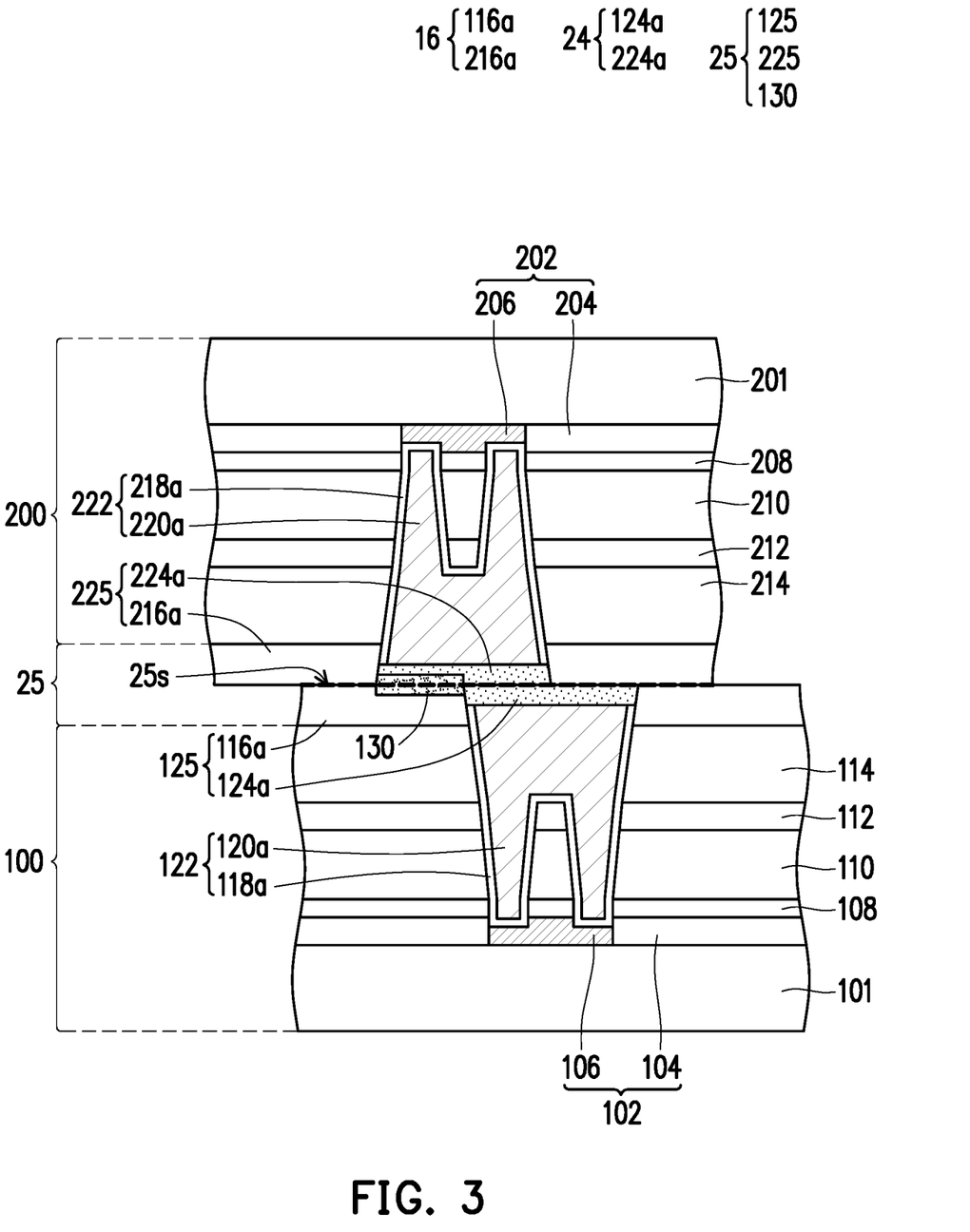
FIG. 3 is a schematic cross-sectional view illustrating a 3DIC according to a third embodiment of the disclosure.

FIG. 3 is a schematic cross-sectional view illustrating a 3DIC according to a third embodiment of the disclosure.

Referring to FIG. 3, basically, the 3DIC illustrated in FIG. 3 is similar to the 3DIC illustrated in FIG. 1E. The difference therebetween is that the blocking layer 130 of FIG. 3 is formed only between the first bonding dielectric layer 116a and the second bonding metal layer 224a, and is not formed between the first bonding metal layer 124a and the second bonding dielectric layer 216a. In detail, when the first bonding dielectric layer 116a and the second bonding dielectric layer 216a have different materials, the blocking layer 130 may be formed or may not be formed at the bonding interface 25s between the first bonding structure 125 and the second bonding structure 225. For example, when the first bonding dielectric layer 116a is a TEOS layer and the second bonding dielectric layer 216a is a nitrogen-doped carbide layer, the TEOS layer 116a may react with the second bonding metal layer 224a (e.g., a Mn layer) to form the blocking layer 130 (e.g., a MnO layer) to inhibits the metal element (e.g., copper) in the second metal pad 222 from diffusing into the hybrid bonding dielectric layer 16 along the bonding interface 25s. On the other hand, the nitrogen-doped carbide layer 216a itself may inhibit the metal element (e.g., copper) in the first metal pad 122 from diffusing. Therefore, the blocking layer may not be formed between the first bonding metal layer 124a and the second bonding dielectric layer 216a that still blocking copper from diffusion. Moreover, when the first bonding dielectric layer 116a is the TEOS layer and the second bonding dielectric layer 216a is the nitrogen-doped carbide layer, the first bonding metal layer 124a may also be a manganese layer, a cobalt layer, a copper layer, or the like.

In an alternative embodiment, the first bonding dielectric layer 116a and the second bonding dielectric layer 216a may have the same material. For example, when the first bonding dielectric layer 116a and the second bonding dielectric layer 216a are both the nitrogen-doped carbide layers, the blocking layer may be not formed between the hybrid bonding dielectric layer 16 and the hybrid bonding metal layer 24 which still has the effect of blocking copper from diffusing.

In summary, in the present invention, the bonding metal layer is formed on the metal pad. In the case, the blocking layer is formed between the bonding metal layer and the bonding dielectric layer when an offset is occurred in the wafer-to-wafer bonding. The blocking layer is able to suppress the metal element in the metal pad from diffusing into the bonding dielectric layer, thereby avoiding the leakage current.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A three-dimensional integrated circuit (3DIC), comprising:
   a first wafer; and
   a second wafer, bonded to the first wafer by a hybrid bonding structure, wherein the hybrid bonding structure comprises a blocking layer disposed between a hybrid bonding dielectric layer and a hybrid bonding metal layer,
   wherein the hybrid bonding metal layer comprises a first bonding metal layer and a second bonding metal layer bonding to each other, at least one of the first bonding metal layer and the second bonding metal layer comprises a primary metal, the primary metal comprises Mn, Co, or a combination thereof, and a content of the primary metal is greater than 50 wt %.

2. The 3DIC of claim 1, wherein a material of the blocking layer is from the hybrid bonding dielectric layer and the hybrid bonding metal layer, and the blocking layer is in direct contact with the hybrid bonding dielectric layer and the hybrid bonding metal layer.

3. The 3DIC of claim 1, wherein the blocking layer comprises manganese oxide (MnO), manganese silicate (MnSiO), manganese oxynitride (MnON), cobalt oxide (CoO), or a combination thereof.

4. The 3DIC of claim 1, wherein a thickness of the blocking layer is between 0.5 nm and 1.0 nm.

5. The 3DIC of claim 1, wherein the hybrid bonding structure comprises:
 a first portion, comprising the first bonding metal layer and the second bonding metal layer bonding to each other;
 a second portion, comprising a first bonding dielectric layer and a second bonding dielectric layer bonding to each other; and
 a third portion, comprising the first bonding metal layer and the second bonding dielectric layer bonding to each other, the first bonding dielectric layer and the second bonding metal layer bonding to each other, and the blocking layer disposed between the first bonding metal layer and the second bonding dielectric layer and disposed between the first bonding dielectric layer and the second bonding metal layer.

6. The 3DIC of claim 5, wherein the first bonding dielectric layer and the second bonding dielectric layer respectively comprise silicon oxide, silicon nitride, silicon oxynitride, nitrogen-doped carbide, silicon carbide, silicon oxycarbide, or a combination thereof.

7. The 3DIC of claim 5, wherein the first wafer comprises a first metal pad embedded in a first dielectric layer, the first metal pad is electrically connected to the first bonding metal layer, and an interface between the first metal pad and the first bonding metal layer comprises a flat surface, a curved surface, or a combination thereof.

8. The 3DIC of claim 7, wherein the first metal pad comprises:
 a first metal layer; and
 a first barrier layer, encapsulating a surface of the first metal layer to separate the first metal layer from the first dielectric layer, wherein the first bonding metal layer covers a top surface of the first metal layer and a top surface of the first barrier layer.

9. The 3DIC of claim 8, wherein the first metal layer and the first bonding metal layer have different materials, and the first metal layer comprises Cu, Al, AlCu, W, or a combination thereof.

10. A manufacturing method of a three-dimensional integrated circuit (3DIC), comprising:
 providing a first wafer; and
 bonding a second wafer to the first wafer by a hybrid bonding structure, wherein the hybrid bonding structure comprises a blocking layer formed between a hybrid bonding dielectric layer and a hybrid bonding metal layer,
 wherein the hybrid bonding metal layer comprises a first bonding metal layer and a second bonding metal layer bonding to each other, at least one of the first bonding metal layer and the second bonding metal layer comprises a primary metal, the primary metal comprises Mn, Co, or a combination thereof, and a content of the primary metal is greater than 50 wt %.

11. The manufacturing method of the 3DIC of claim 10, wherein the providing the first wafer comprises:
 forming a first interconnect structure on a first substrate;
 sequentially forming a first dielectric layer and a first bonding dielectric layer on the first interconnect structure;
 forming a first opening in the first dielectric layer and the first bonding dielectric layer to expose the first interconnect structure;
 filling in the first opening with a first metal material;
 performing a grinding process on the first metal material to form a first metal pad and form a first recess on the first metal pad; and
 forming the first bonding metal layer in the first recess, thereby forming a first bonding structure.

12. The manufacturing method of the 3DIC of claim 11, wherein a bottom surface of the first recess comprises a flat surface, a curved surface, or a combination thereof.

13. The manufacturing method of the 3DIC of claim 11, wherein a top surface of the first metal pad is lower than a top surface of the first bonding dielectric layer.

14. The manufacturing method of the 3DIC of claim 11, wherein a top surface of the first bonding metal layer is substantially coplanar with a top surface of the first bonding dielectric layer.

15. The manufacturing method of the 3DIC of claim 11, wherein the bonding the second wafer to the first wafer comprises:
 forming a second bonding structure on the second wafer, wherein the second bonding structure comprises a second bonding dielectric layer and the second bonding metal layer embedded in the second bonding dielectric layer;
 aligning the first bonding structure with the second bonding structure; and
 performing a bonding process, so that the first bonding metal layer and the second bonding metal layer are bonded to each other, the first bonding dielectric layer and the second bonding dielectric layer are bonded to each other, and the blocking layer is formed between the first bonding metal layer and the second bonding dielectric layer and formed between the first bonding dielectric layer and the second bonding metal layer.

16. The manufacturing method of the 3DIC of claim 15, wherein the blocking layer is made by reacting the first bonding metal layer with the second bonding dielectric layer and reacting the first bonding dielectric layer with the second bonding metal layer.

17. The manufacturing method of the 3DIC of claim 15, wherein the blocking layer comprises manganese oxide (MnO), manganese silicate (MnSiO), manganese oxynitride (MnON), cobalt oxide (CoO), or a combination thereof.

18. The manufacturing method of the 3DIC of claim 15, wherein the first bonding dielectric layer and the second bonding dielectric layer respectively comprise silicon oxide, silicon nitride, silicon oxynitride, nitrogen-doped carbide, silicon carbide, silicon oxycarbide, or a combination thereof.

* * * * *